(12) United States Patent
Simon et al.

(10) Patent No.: US 7,570,342 B2
(45) Date of Patent: Aug. 4, 2009

(54) RADIATION EXPOSURE APPARATUS COMPRISING A GAS FLUSHING SYSTEM

(75) Inventors: Klaus Simon, Eindhoven (NL); Enno Van Den Brink, Eindhoven (NL); Gerardus Johannes Joseph Keijsers, Venlo (NL); Adrianus Hubertus Henricus Van Dijk, Helmond (NL); Hubertus Antonius Marinus Baijens, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 493 days.

(21) Appl. No.: 11/294,348

(22) Filed: Dec. 6, 2005

(65) Prior Publication Data

US 2006/0146300 A1   Jul. 6, 2006

Related U.S. Application Data

(63) Continuation-in-part of application No. 11/036,186, filed on Jan. 18, 2005, now abandoned.

(60) Provisional application No. 60/633,727, filed on Dec. 7, 2004.

(51) Int. Cl.
*G03B 27/52* (2006.01)
*G03B 27/42* (2006.01)

(52) U.S. Cl. .......................... 355/30; 355/53
(58) Field of Classification Search ............... 355/30, 355/53, 55; 250/548
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,559,584 A | 9/1996 | Miyaji et al. | 355/73 |
| 5,633,698 A | 5/1997 | Imai | 355/72 |
| 5,969,441 A | 10/1999 | Loopstra et al. | |
| 6,542,220 B1 | 4/2003 | Schrijver et al. | |
| 6,555,834 B1 | 4/2003 | Loopstra | |
| 6,671,396 B1 | 12/2003 | Chang et al. | |
| 6,690,049 B2 | 2/2004 | Suzuki et al. | |
| 6,710,370 B2 | 3/2004 | Street et al. | |
| 6,721,031 B2 | 4/2004 | Hasegawa et al. | 355/30 |
| 6,747,729 B2 | 6/2004 | Pril et al. | 355/30 |
| 6,771,314 B1 | 8/2004 | Bawolek et al. | |
| 6,828,569 B2 | 12/2004 | Van Schaik et al. | |
| 6,987,278 B2 | 1/2006 | Loopstra | 250/492.3 |

(Continued)

FOREIGN PATENT DOCUMENTS

EP    1 098 226 A2    5/2001

(Continued)

OTHER PUBLICATIONS

European Search Report issued for European Patent Application No. 05257485.2—2222, dated Nov. 2, 2006.

(Continued)

*Primary Examiner*—Hung Henry Nguyen
(74) *Attorney, Agent, or Firm*—Pillsbury Winthrop Shaw Pittman LLP

(57) ABSTRACT

An exposure apparatus is provided with a radiation source, a patterning structure, a projection system, a substrate, and a gas flushing system for removing gas from an area between the projection system and the substrate.

9 Claims, 4 Drawing Sheets

U.S. PATENT DOCUMENTS

| | | | |
|---|---|---|---|
| 7,057,701 B2 * | 6/2006 | Chibana et al. | 355/30 |
| 2003/0006380 A1 | 1/2003 | Van Empel et al. | |
| 2003/0146396 A1 | 8/2003 | Loopstra | |
| 2003/0224265 A1 * | 12/2003 | Okoroanyanwu | 430/30 |
| 2004/0021844 A1 | 2/2004 | Suenaga | |
| 2004/0165195 A1 | 8/2004 | Sato et al. | 356/614 |
| 2004/0212791 A1 | 10/2004 | De Bokx et al. | |
| 2005/0030496 A1 | 2/2005 | Chibana et al. | 355/30 |
| 2005/0112508 A1 | 5/2005 | Van Schaik et al. | |
| 2005/0264773 A1 | 12/2005 | Beckers et al. | |
| 2006/0119813 A1 * | 6/2006 | Hultermans et al. | 355/53 |

FOREIGN PATENT DOCUMENTS

| | | |
|---|---|---|
| EP | 1 098 226 A3 | 1/2002 |
| EP | 1 229 573 A1 | 8/2002 |
| EP | 1 339 099 A1 | 8/2003 |
| EP | 1 600 819 A1 | 11/2005 |
| JP | 2000-200745 | 7/2000 |
| JP | 2004-080052 | 3/2004 |
| JP | 2004-266051 | 9/2004 |
| WO | WO 98/33096 A1 | 7/1998 |
| WO | WO 98/38597 A2 | 9/1998 |
| WO | WO 98/38597 A3 | 9/1998 |
| WO | WO 98/40791 A1 | 9/1998 |
| WO | WO 03/076086 A1 | 9/2003 |

OTHER PUBLICATIONS

European Search Report issued for European Patent Application No. 05257485.2—2222, dated Aug. 29, 2006.

Taiwanese Office Action issued for ROC (Taiwan) Patent Application No. 094142799, dated Nov. 28, 2006.

* cited by examiner a.

b.

c.

RADIATION EXPOSURE APPARATUS COMPRISING A GAS FLUSHING SYSTEM

CROSS-REFERENCE TO RELATED APPLICATIONS

This application is a continuation-in-part of U.S. application Ser. No. 11/036,186, which was filed on Jan. 18, 2005, and claims the benefit of U.S. provisional application 60/633,727, filed 7 Dec. 2004. Both earlier applications are hereby incorporated in their entirety by reference.

FIELD OF THE INVENTION

This invention relates to a radiation exposure apparatus, e.g. a lithographic projection apparatus, and more particularly to an exposure apparatus including a gas flushing system. Also, this invention relates to methods concerning exposing a substrate to radiation.

BACKGROUND

The use of resist-type materials for color filters in the production of image sensors, such as Charged Coupled Device (CCD) image sensors and Complimentary Metal Oxide Semiconductor (CMOS) image sensors, raises contamination concerns. For instance, volatile components in the resists may cause substantial out-gassing during exposure to radiation, e.g. during exposure to radiation in a lithographic image sensor manufacturing process. The out-gassing may lead to contamination and damage of the projection lens or the surrounding area, which in turn may require increased maintenance to clean the lens or even replacement of the lens or surrounding parts. Objectives of the present invention include providing methods and apparatus addressing out-gassing concerns.

Lithography systems employing gas purgehoods are mentioned in EP 1098226 and U.S. 2004-0212791.

SUMMARY OF THE INVENTION

In one embodiment, the present invention provides a method of manufacturing a device, e.g. an image sensor, comprising:
(a) providing a beam of radiation;
(b) patterning the beam of radiation;
(c) projecting the patterned beam of radiation via a projection system onto a target portion of a substrate comprising a radiation-sensitive layer; and
(d) flowing a flushing gas from a first gas outlet positioned outside the circumference of said target portion to a space between said projection system and said substrate;

wherein at least part of said flushing gas flows towards said target portion.

Also, the present invention provides a method comprising:
(a) providing a beam of radiation;
(b) patterning the beam of radiation;
(c) projecting the patterned beam of radiation via a projection system onto a target portion of a substrate comprising one or more color filter layers; and
(d) extracting gases emanating from said target portion during exposure of said target portion to said patterned beam of radiation by providing an air flow in the space between said target portion and said projection system.

Furthermore, the present invention provides a lithographic projection apparatus comprising:

a radiation system constructed and arranged to supply a projection beam of radiation;

a support structure constructed and arranged to support a patterning structure, the patterning structure being constructed and arranged to pattern the projection beam according to a desired pattern;

a substrate support constructed and arranged to support a substrate;

a projection system constructed and arranged to project the patterned beam onto a target portion of the substrate; and a gas flushing system constructed and arranged to extract gas from the space between the substrate support and the projection system.

Also, the present invention provides a process comprising exposing a portion of a substrate having one or more color filter resist layers to radiation and extracting gases emanating from the portion being exposed with a gas flushing system.

Furthermore, the present invention provides a gas flushing system designed to only extract gas and not supply gas.

In addition, the present invention provides a gas flushing system having one or more openings covered with a transparent material, e.g. glass or a pellicle.

Furthermore, the present invention provides an apparatus for the manufacturing of image sensors, wherein the apparatus comprises a gas flushing system for removal of gases emanating from, e.g., one or more color filter resist layers.

Additional objects, advantages and features of the present invention are set forth in this specification, and in part will become apparent to those skilled in the art on examination of the following, or may be learned by practice of the invention. The inventions disclosed in this application are not limited to any particular set of or combination of objects, advantages and features. It is contemplated that various combinations of the stated objects, advantages and features make up the inventions disclosed in this application.

DETAILED DESCRIPTION

Figure 1:
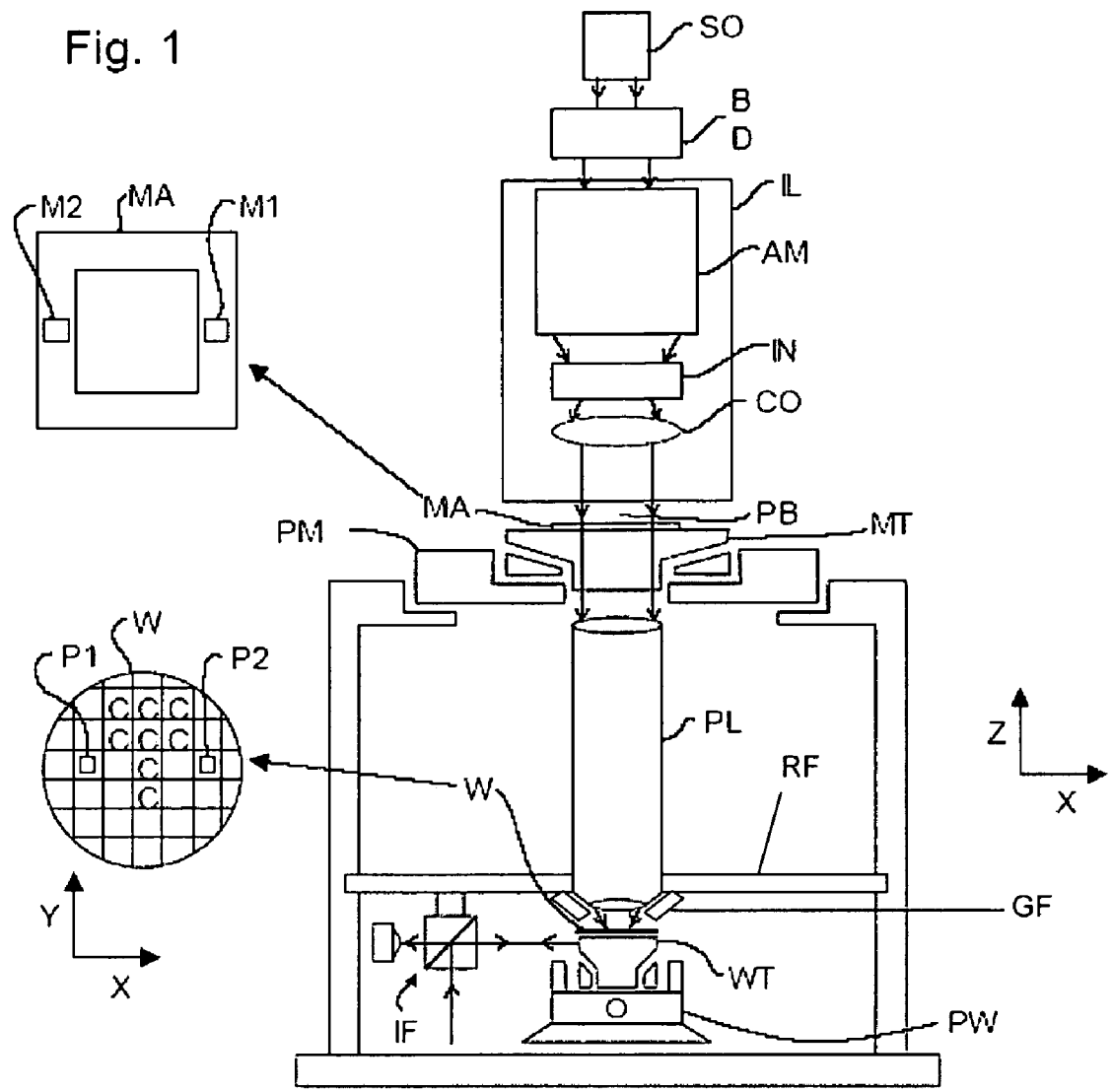
FIG. 1 represents an exposure apparatus according to an embodiment of the present invention.

The term "patterning structure" used herein should be broadly interpreted as referring to structure that may be used to endow an incoming radiation beam with a patterned cross-section, corresponding to a pattern that is to be created in a target portion of the substrate; the term "light valve" may also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask may be held at a desired position in the incoming radiation beam, and that it may be moved relative to the beam if so desired;

An array of individually controllable elements, for instance a programmable mirror array or a programmable LCD array. One example of a programmable mirror array is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light may be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors may reflect an incoming radiation beam in a different direction to unaddressed mirrors; in this manner, the reflected beam is patterned according to the addressing pattern of the matrix-addressable mirrors. The matrix addressing may be performed using suitable electronic devices. In both of the situations described hereabove, the patterning structure may comprise one or more programmable mirror arrays. More information on mirror arrays as here referred to may be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required. A programmable LCD array. An example of a programmable LCD array is given in, for instance, U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

The term "outlet" as used herein may also be considered or termed as an outlet port. Similarly, the term "inlet" as used herein may also be considered or termed as an inlet port. It should be understood that the terms outlet, outlet port, inlet and inlet port broadly refer to a structure through which a gas or substance flows.

In a manufacturing process using a lithographic projection apparatus, a pattern (e.g. in a mask) may be imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an image sensor, a flat panel display, or an integrated ciruit. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices may be mounted on a carrier, connected to pins, etc. Further information regarding such processes may be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

FIG. 1 schematically depicts a lithographic apparatus according to a particular embodiment of the invention. The apparatus comprises:

an illumination system (illuminator) IL for providing a projection beam PB of radiation (e.g. UV radiation or DUV radiation).

a first support structure (e.g. a mask table) MT for supporting patterning means (e.g. a mask) MA and connected to first positioning means PM for accurately positioning the patterning means with respect to projection system PL;

a substrate table (e.g. a wafer table) WT for holding a substrate (e.g. a resist-coated wafer) W and connected to second positioning means PW for accurately positioning the substrate with respect to projection system PL;

a projection system (e.g. a refractive projection lens) PL for imaging a pattern imparted to the projection beam PB by patterning means MA onto a target portion C (e.g. comprising one or more dies) of the substrate W; and a gas flushing system GF. As depicted here, the gas flushing system is secured via a frame. However, the flushing system GF may be secured in any suitable manner.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. In one embodiment, the radiation source supplies radiation of at least 126 nm, e.g. at least 157 nm or at least 193 nm, for instance in the range of 193-435 nm or, such as 193 nm, 248 nm, or 365 nm, or in the range of 220-435 nm. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator may be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning means PW and position sensor IF (e.g. an interferometric device), the substrate table WT may be moved accurately, e.g. so as to position different target portions C in the path of the beam PB. Similarly, the first positioning means PM and another position sensor (which is not explicitly depicted in FIG. 1) may be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C may be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation may be readily applied to maskless lithography that utilizes programmable patterning means, such as a programmable mirror array of a type as referred to above.

Combinations and/or variations on the above described modes of use or entirely different modes of use may also be employed.

Figure 2:
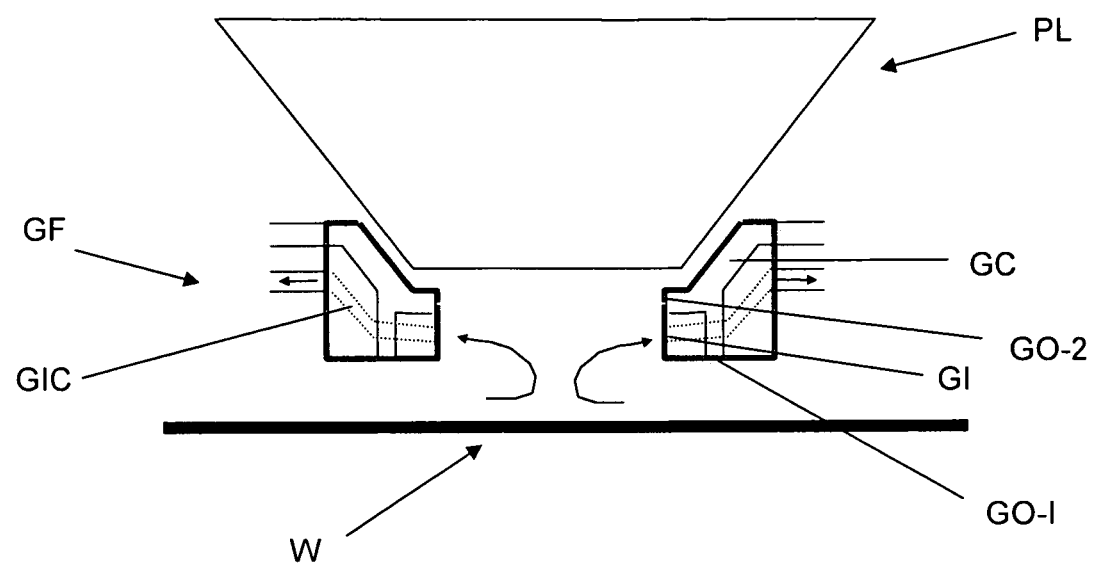
FIG. 2 represents a cross-sectional front view of an embodiment of a gas flushing system according to the present invention.

FIG. 2 represents an embodiment of the gas flushing system GF in more detail. Gas flushing system GF comprises a first gas outlet GO-1 and a second gas outlet GO-2. In the depicted embodiment, GO-1 and GO-2 are connected via gas supply channel GC to a flushing gas supply (not shown) comprising a gas source (not shown) and optionally a flow regulator (not shown). As depicted in FIG. 2, i.e. by being directly connected via gas supply channel GC, both GO-1 and GO-2 receive gas from a single source. However, GO-1 and GO-2 may also each have a separate gas supply channel, whereby the separate gas supply channels may receive gas from the same source or each may receive gas from a separate gas source. In one embodiment, at least gas outlet GO-1 receives an oxygen containing gas. In one embodiment, at least 1 mole % of the gas supplied to GO-1 is oxygen, for instance at least 5 mole %, at least 10 mole %, for instance 10-50 mole % or 10-30 mole %. In one embodiment, the gas supplied to GO-1 is air. In one embodiment, GO-2 receives an inert gas, for instance nitrogen, argon, helium, xenon, or mixtures thereof. In other embodiments, both GO-1 and GO-2 receive an inert gas or an oxygen containing gas.

In one embodiment, as indicated in FIG. 2, at least part of the gas exiting GO-1 is directed towards the target portion of substrate W that is being exposed to the radiation exiting the projection system PL (i.e., at least part of the gas exiting GO-1 is directed towards the substrate and angled towards the area being exposed to the radiation). In one embodiment, essentially all gas exiting GO-1 is directed towards the target portion of substrate W that is being exposed to the radiation exiting the projection system PL (only the bottom section of projection system PL is shown).

In one embodiment, the gas flow from outlet GO-1 is adjusted such that, at the used substrate table (or substrate support) velocity, the velocity of the radial gas flow, at every location in the space between the gas flushing system and the substrate is higher than zero and directed inwards, i.e. towards the area between the substrate and the projection system. The radial gas flow velocity is the vectorial sum of gas flow speed created at the outlet(s) GO-1 and the substrate table velocity. The term "substrate table velocity" includes, e.g., the substrate table (or substrate support) scanning velocity of a step-and-scan type lithographic projection apparatus, as well as, in the case of a step-and-repeat type lithographic projection apparatus, the velocity of the wafer table between subsequent exposures.

Furthermore, remaining with FIG. 2, gas flushing system GF comprises a gas inlet GI for extracting gas from the space between the target portion being exposed and the projection system. Gas inlet GI is connected via channel GIC to a gas extraction system (not shown), which may include a vacuum pump and/or a fan for facilitating the removal of the gas. Also, the gas extraction system may include a flow regulator.

In one embodiment, the gas flushing system comprises one or more sensors, e.g. for determining the amount and/or type of harmful gases entering the area between the substrate and the projection system. The one or more sensors may be used to adjust the composition and/or rate of the flushing gas, e.g. relative to the amount and/or type of harmful gases entering the area between the substrate and the projection system. Also, the one or more sensors may be used to monitor the proper functioning of the gas flushing system and to provide, e.g., a warning if the flow rate through the gas inlet GI is too low.

Figure 3:
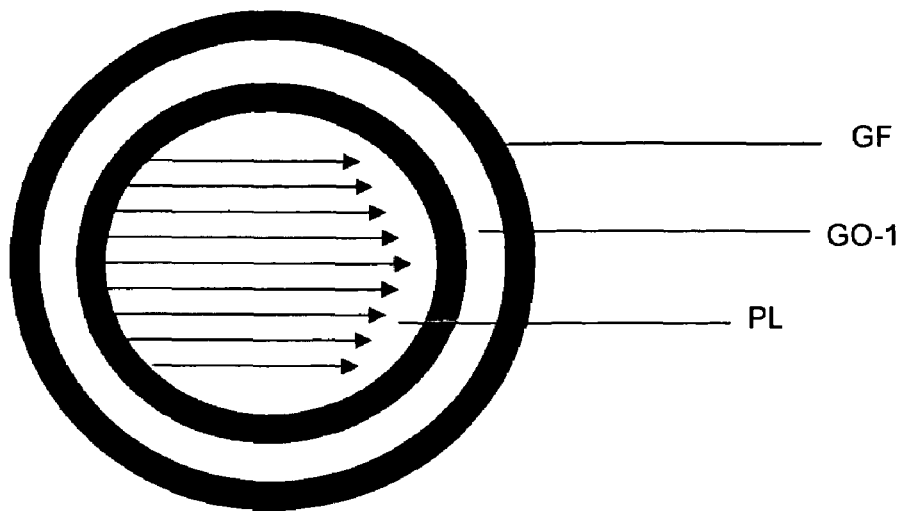
FIGS. 3a-c represent several embodiments of a bottom view of a gas flushing system and final lens element of a projection system according to the present invention.
Figure 3:
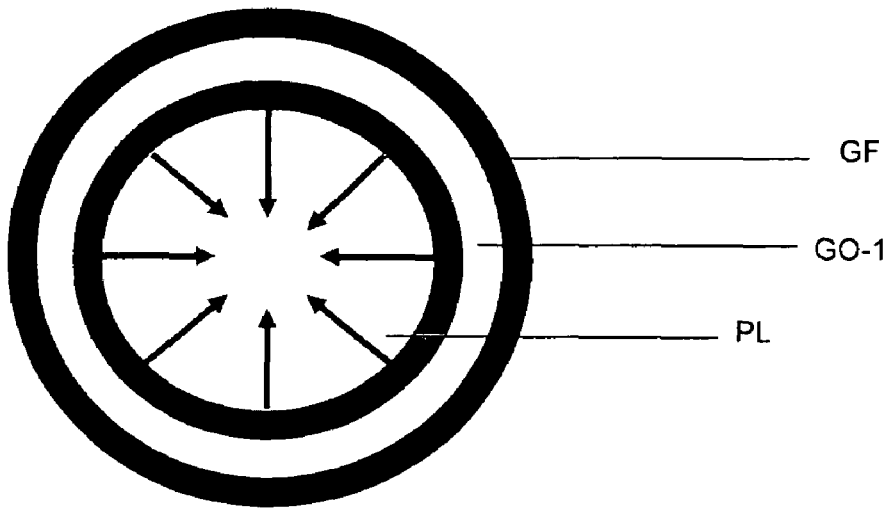
Figure 3:
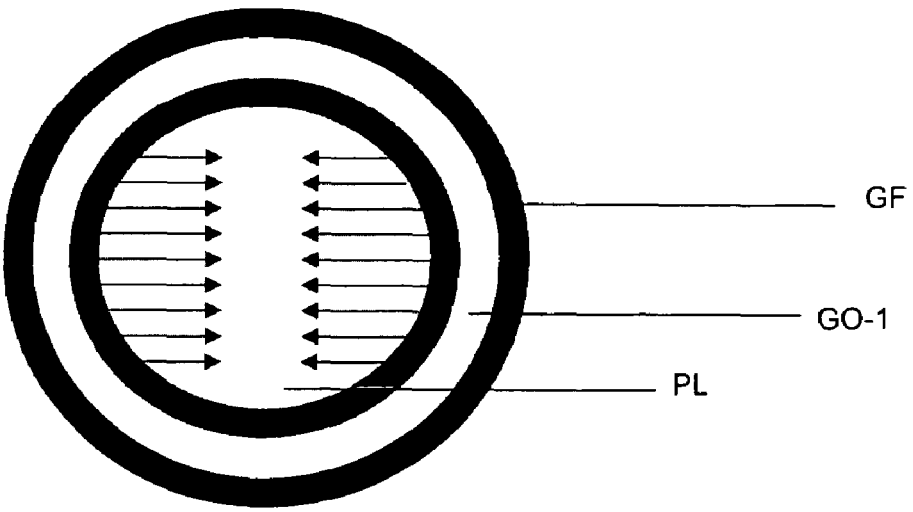

Referring to FIG. 3, several embodiments for providing gas outlet GO-2 are shown. In the embodiment of FIG. 3a, the gas flushing system GF has a circular construction and, along its inner circumference, only part of the gas flushing system is provided with a gas outlet section GO-2. In FIG. 3b, gas outlet ports GO-2 are provided all along the inner circumference of the gas flushing system, and in FIG. 3c the gas flushing system GF is provided with opposing gas outlet ports. In one embodiment, gas outlet port(s) GO-2 provide a laminar flow substantially parallel to the surface of the substrate and/or the surface of the bottom lens of projection system PL.

In one embodiment, the provided is a lithographic projection apparatus comprising:
(a) a radiation system constructed and arranged to supply a projection beam of radiation;
(b) a support structure constructed and arranged to support a patterning structure, the patterning structure being constructed and arranged to pattern the projection beam according to a desired pattern;
(c) a substrate support constructed and arranged to support a substrate;
(d) a projection system constructed and arranged to project the patterned beam onto a target portion of the substrate; and
(e) a gas flushing system comprising radial gas flow outlets, said gas flushing system being constructed and arranged to generate a radial gas flow through said radial gas flow outlets in an intermediate space defined between said gas flushing system and said substrate, with at least part of said radial gas flow having a radial velocity directed towards the area between the substrate and the projection system.

In an embodiment, provided is a lithographic projection apparatus comprising:
a radiation system constructed and arranged to supply a projection beam of radiation;
a support structure constructed and arranged to support a patterning structure, the patterning structure constructed and arranged to pattern the projection beam according to a desired pattern;
a substrate support constructed and arranged to support a substrate;
a projection system constructed and arranged to project the patterned beam onto a target portion of the substrate; and
a gas flushing system that creates a laminar flow in a first direction across said substrate, and further creates a secondary flow having portions thereof traveling in at least one direction substantially different from said first direction, said secondary flow being generally below said laminar flow, the gas flushing system further creating a gas flow in between said laminar flow and said secondary flow designed to remove gas introduced by at least said secondary flow.

In an embodiment, provided is a lithographic projection apparatus comprising:
a radiation system constructed and arranged to supply a projection beam of radiation;
a support structure constructed and arranged to support a patterning structure, the patterning structure constructed and arranged to pattern the projection beam according to a desired pattern;
a substrate support constructed and arranged to support a substrate;
a projection system constructed and arranged to project the patterned beam onto a target portion of the substrate; and a gas flushing system that includes a first outlet that generates a laminar flow in a first direction, generally parallel to an upper surface of said substrate, and a second outlet that directs gas in a direction towards said target portion.

Figure 4:
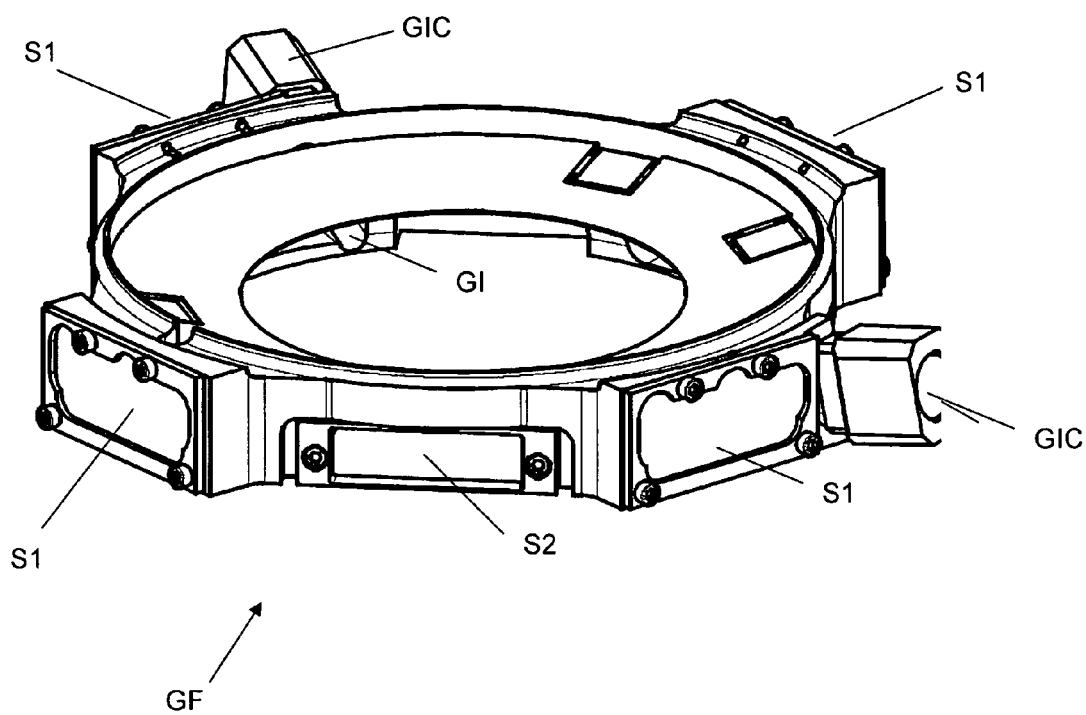
FIG. 4 represents a further embodiment of a gas flushing system according to the present invention.

FIG. 4 shows an embodiment of a gas flushing system GF having no gas outlet ports but only gas inlet ports GI. Air flow is created by connecting the gas inlet port channels GIC to a gas extraction system (not shown) and using the gas extraction system to suck air from other areas of the lithographic apparatus towards the gas inlet ports GI and through the gas inlet port channels GIC. This embodiment may be advantageous, e.g., when the lithographic apparatus design does not allow sufficient space between the wafer stage and last lens element to have both gas supply channels (gas outlets) and gas extraction channels (gas inlets). The embodiment of gas flushing system GF in FIG. 4 also has openings S1 and S2 which allow sensor/measurement beams to reach the wafer through the gas flushing system. Note that although only one opening S2 is visible in FIG. 4, the gas flushing system GF may have a plurality of openings S2, for instance 4 equidistant openings (compare openings S1). In an embodiment, opening S1 allows access to the wafer for an image sensor (e.g. a reflective image sensor) and S2 allows access for a level sensor. In an embodiment, the openings are covered with windows, e.g. glass or pellicles. In an embodiment, openings S1 are covered with glass. In an embodiment, openings S2 are covered with pellicles. Covering the openings may be useful, e.g., in preventing gases from exiting the gas flushing system through these openings.

While not limited thereto, the gas flushing system is useful in processes where there is a risk of harmful gases evaporating from a substrate during exposure to radiation. Such gases may, for instance, damage the projection system or surrounding parts, which may in turn require increased maintenance and/or shorten the lifetime of the projection system or surrounding parts. The gas flushing system of the present invention is helpful in preventing such damage by substantially preventing harmful gases from reaching the projection system or surrounding parts. Substrates that are prone to releasing gases are, for instance, substrates coated with one or more resist layers. Particularly, substrates coated with resist layers for one or more color filter layers may be susceptible to releasing gases. Substrates coated with resist layers for one or more color filter layers may be used in the manufacturing of image sensors, for instance image sensors useful in cameras (e.g. photocameras or videocameras).

Having described specific embodiments of the present invention, it will be understood that many modifications thereof will readily appear or may be suggested to those skilled in the art, and it is intended therefore that this invention is limited only by the spirit and scope of the following claims.

What is claimed is:
1. A method comprising:
patterning a beam of radiation;
projecting the patterned beam of radiation via a projection system onto a target portion of a substrate comprising one or more resist layers for manufacturing one or more color filter layers; and
creating an air flow in the space between said target portion and said projection system to extract gases emanating from said target portion during said projecting, wherein said air flow is created by only extracting air from said space and also not supplying air to said space.
2. A lithographic projection apparatus comprising:
a radiation system constructed and arranged to supply a projection beam of radiation;

a support structure constructed and arranged to support a patterning structure, the patterning structure being constructed and arranged to pattern the projection beam according to a desired pattern;

a substrate support constructed and arranged to support a substrate;

a projection system constructed and arranged to project the patterned beam onto a target portion of the substrate; and a gas flushing system constructed and arranged to extract gases emanating from said target portion in the space between the substrate support and the projection system during operation of the projection system, wherein said gas flushing system is constructed to only extract gas rather than also supply gas.

3. The apparatus of claim 2, wherein one or more openings are provided in said gas flushing system to allow access of sensor beams to the substrate.

4. The apparatus of claim 2, wherein said projection beam of radiation has a wavelength in the range of 220-435 nm.

5. The apparatus according to claim 2, wherein said apparatus is designed to operate in step mode.

6. The apparatus according to claim 2, wherein said apparatus is designed to operate in scan mode.

7. A process comprising exposing a substrate to radiation with the apparatus of claim 2.

8. The process of claim 7, wherein said substrate comprises one or more resist layers.

9. The process of claim 8, wherein said one or more resist layers are for the manufacturing of one or more color filter layers.

* * * * *